(12) United States Patent
Zhang et al.

(10) Patent No.: US 10,708,522 B2
(45) Date of Patent: Jul. 7, 2020

(54) IMAGE SENSOR WITH ANALOG SAMPLE AND HOLD CIRCUIT CONTROL FOR ANALOG NEURAL NETWORKS

(71) Applicant: INTERNATIONAL BUSINESS MACHINES CORPORATION, Armonk, NY (US)

(72) Inventors: Xin Zhang, Yorktown Heights, NY (US); Jin Ping Han, Yorktown Heights, NY (US); Dennis M. Newns, Yorktown Heights, NY (US); Xiaodong Cui, Chappaqua, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/100,249

(22) Filed: Aug. 10, 2018

(65) Prior Publication Data
US 2020/0053299 A1   Feb. 13, 2020

(51) Int. Cl.
*H04N 5/341* (2011.01)
*H01L 25/16* (2006.01)
(Continued)

(52) U.S. Cl.
CPC .......... *H04N 5/341* (2013.01); *H01L 25/167* (2013.01); *H04N 5/2353* (2013.01); *H04N 5/23229* (2013.01)

(58) Field of Classification Search
CPC .. H04N 5/341; H04N 5/2353; H04N 5/23229; H01L 25/167
See application file for complete search history.

(56) References Cited

U.S. PATENT DOCUMENTS 5,218,440 A   6/1993  Mathur
5,249,954 A   10/1993 Allen et al.
(Continued)

FOREIGN PATENT DOCUMENTS

CN   102665049 A   9/2012

OTHER PUBLICATIONS

J. L. Johnson et al., "PCNN models and applications", IEEE Transactions on Neural Networks, vol. 10, No. 3, 1999, pp. 480-498.
(Continued)

*Primary Examiner* — Lin Ye
*Assistant Examiner* — Tuan H Le
(74) *Attorney, Agent, or Firm* — Cantor Colburn LLP; Vazken Alexanian

(57) ABSTRACT

According to one or more embodiments of the present invention, an image processing system includes a cross-point synapse array that includes multiple row wires, multiple column wires, and multiple cross-point devices, a cross-point device at each intersection of the row wires and the column wires. The image processing system further includes an image sensor array that includes multiple pixel unit circuits, each pixel unit circuit is connected to a corresponding row wire of the cross-point synapse array, wherein the pixel unit circuit generates a voltage output based on an input light. The image processing system further includes a pixel unit controller that adjusts an exposure time of the pixel unit circuits based on voltage outputs from the pixel unit circuits respectively.

20 Claims, 10 Drawing Sheets

(51) Int. Cl.
  *H04N 5/232* (2006.01)
  *H04N 5/235* (2006.01)

(56) References Cited

U.S. PATENT DOCUMENTS

| | | |
|---|---|---|
| H001415 H | 2/1995 | Merryman |
| 5,680,481 A | 10/1997 | Prasad et al. |
| 5,835,901 A | 11/1998 | Duvoisin, III et al. |
| 6,130,423 A | 10/2000 | Brehmer et al. |
| 9,806,072 B2 | 10/2017 | Chang |
| 2002/0191831 A1 | 12/2002 | Spoto et al. |
| 2005/0057546 A1* | 3/2005 | Shibutani ............... G09G 3/22 345/204 |
| 2011/0050969 A1* | 3/2011 | Nishihara ............... G01J 1/44 348/296 |
| 2011/0317469 A1* | 12/2011 | Borghetti ............... G11C 5/063 365/148 |
| 2013/0076950 A1* | 3/2013 | Eshraghian ........ G11C 13/0007 348/308 |
| 2018/0039882 A1 | 2/2018 | Ikeda et al. |

OTHER PUBLICATIONS

J.W. Mills, "The continuous retina: image processing with a single-sensor artificial neural field network", Neural Networks, IEEE International Conference on Year: 1996, vol. 2, 1996, pp. 886-891.

K. Cho et al., "Scalable image sensor/processor architecture with frame memory buffer and 2-D cellular neural network", Circuits and Systems, ISCAS '98 Proceedings of the 1998 IEEE International Symposium, vol. 4, 1998, pp. 73-76.

* cited by examiner f(x) = f (INPUT 1 * CONNECTION STRENGTH 1 + INPUT 2 * CONNECTION STRENGTH 2)

IMAGE SENSOR WITH ANALOG SAMPLE AND HOLD CIRCUIT CONTROL FOR ANALOG NEURAL NETWORKS

BACKGROUND

The present invention relates in general to image sensors. More specifically, the present invention relates to image sensors with analog sample-and-hold circuit control to implement artificial neural networks (ANNs) using cross-point devices.

Programmed computers have been used to perform image analysis functions such as character recognition and image recognition. "Image recognition" refers to the ability of a computer to decipher and understand the information fed to it from an image, including, for example, still images, video, graphics, or even live video. In order to program computers to process visual data, the computer must be programmed to recognize patterns. "Machine learning" is a complex programming techniques that can be used to allow computers to learn image-related features. Machine learning computers can analyze thousands of images to find patterns, match the various patterns to each other, and output a meaningful analysis of them.

In machine learning and cognitive science, ANNs are a family of statistical learning models inspired by the biological neural networks of animals, and in particular the brain. ANNs can be used to estimate or approximate systems and functions that depend on a large number of inputs and are generally unknown. ANNs can include DNNs, convolutional neural networks (CNNs), and other types of neural networks. Crossbar arrays are high density, low cost circuit architectures used to form a variety of electronic circuits and devices, including ANN architectures, neuromorphic microchips and ultra-high density nonvolatile memory. A basic crossbar array configuration includes a set of conductive row wires and a set of conductive column wires formed to intersect the set of conductive row wires. The intersections between the two sets of wires are separated by so-called cross-point devices.

SUMMARY

According to one or more embodiments of the present invention, an image processing system includes a cross-point synapse array that includes multiple row wires, multiple column wires, and multiple cross-point devices, a cross-point device at each intersection of the row wires and the column wires. The image processing system further includes an image sensor array that includes multiple pixel unit circuits, each pixel unit circuit is connected to a corresponding row wire of the cross-point synapse array, wherein the pixel unit circuit generates a voltage output based on an input light. The image processing system further includes a pixel unit controller that adjusts an exposure time of the pixel unit circuits based on voltage outputs from the pixel unit circuits respectively.

According to one or more embodiments of the present invention, a system includes a cross-point synapse array that includes multiple row wires, multiple column wires, and multiple cross-point devices, a cross-point device at each intersection of the row wires and the column wires. The system further includes multiple pixel unit circuits, each pixel unit circuit is coupled with a predetermined set of cross-point devices. The pixel unit circuit generates a voltage output based on an input light, the voltage output being sent to the set of cross-point devices for conversion to corresponding current signals. Further, a pixel unit controller is coupled with the cross-point synapse array, the pixel unit controller adjusts an exposure time of the pixel unit circuits based on voltage outputs from the pixel unit circuits respectively.

According to one or more embodiments of the present invention, a computer-implemented method for operating a neural network system includes receiving, by multiple pixel unit circuits in an image sensor array, a reset signal from a pixel unit controller. Each pixel unit circuit is connected to a corresponding row wire of a cross-point synapse array, the cross-point synapse array including multiple row wires, multiple column wires, and multiple cross-point devices, a cross-point device at each intersection of the row wires and the column wires. The method further includes receiving, by the multiple pixel unit circuits in the image sensor array, a sample-and-hold signal from the pixel unit controller, each pixel unit circuit generating a voltage output based on an input light for an exposure time duration of a sample phase of the sample-and-hold signal. The method further includes sending the voltage output from the multiple pixel unit circuits in the image sensor array to corresponding cross-point devices in a cross-point synapse array for conversion to corresponding current signals during a hold phase of the sample-and-hold signal. The method further includes adjusting, by the pixel unit controller, the exposure time of the pixel unit circuits based on the voltage outputs from the pixel unit circuits respectively.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The examples described throughout the present document will be better understood with reference to the following drawings and description. The components in the figures are not necessarily to scale. Moreover, in the figures, like-referenced numerals designate corresponding parts throughout the different views.

Figure 1:
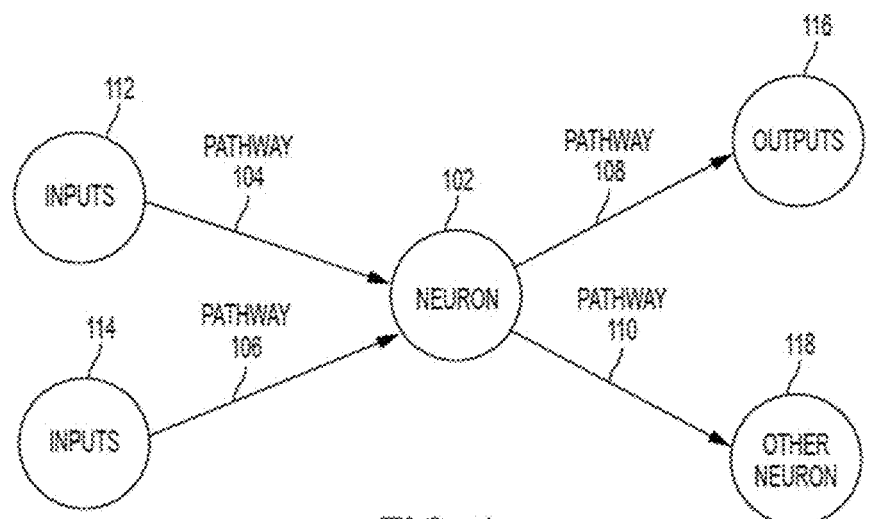
FIG. 1 depicts a simplified diagram of input and output connections of a biological neuron.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

DETAILED DESCRIPTION

Described herein are technical solutions for integrating image sensor(s) with analog neural networks efficiently with small signal degradation. The technical solutions include using image sensor devices with analog neural network synapse matrices extrinsically and/or intrinsically. The one or more embodiments of the present invention facilitate reducing signal degradation compared to existing techniques of connecting image sensors with neural network systems. As such the technical solutions are rooted in and/or tied to computer technology in order to overcome a problem specifically arising in the realm of computers, specifically training and using neural networks, such as for image recognition, image detection, and other such machine learning techniques that use images.

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" can be understood to include any integer number greater than or equal to one, i.e. one, two, three, four, etc. The terms "a plurality" can be understood to include any integer number greater than or equal to two, i.e. two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

It is understood in advance that although one or more embodiments are described in the context of biological neural networks with a specific emphasis on modeling brain structures and functions, implementation of the teachings recited herein are not limited to modeling a particular environment. Rather, embodiments of the present invention are capable of modeling any type of environment, including for example, weather patterns, arbitrary data collected from the internet, and the like, as long as the various inputs to the environment can be turned into a vector.

Artificial neural networks (ANNs) can be used to estimate or approximate systems and functions that depend on a large number of inputs and are generally unknown. Neural networks use a class of algorithms based on a concept of interconnected "neurons." In a typical neural network, neurons have a given activation function that operates on the inputs. By determining proper connection weights (a process also referred to as "training"), a neural network achieves efficient recognition of a desired patterns, such as images and characters. Oftentimes, these neurons are grouped into "layers" in order to make connections between groups more obvious and to each computation of values. Training the neural network is a computationally intense process.

ANNs are often embodied as so-called "neuromorphic" systems of interconnected processor elements that act as simulated "neurons" and exchange "messages" between each other in the form of electronic signals. Similar to the so-called "plasticity" of synaptic neurotransmitter connections that carry messages between biological neurons, the connections in ANNs that carry electronic messages between simulated neurons are provided with numeric weights that correspond to the strength or weakness of a given connection. The weights can be adjusted and tuned based on experience, making ANNs adaptive to inputs and capable of learning. For example, an ANN for handwriting recognition is defined by a set of input neurons which can be activated by the pixels of an input image. After being weighted and transformed by a function determined by the network's designer, the activations of these input neurons are then passed to other downstream neurons, which are often referred to as "hidden" neurons. This process is repeated until an output neuron is activated. The activated output neuron determines which character was read.

Crossbar arrays, also known as crosspoint arrays or crosswire arrays, are high density, low cost circuit architectures used to form a variety of electronic circuits and devices, including ANN architectures, neuromorphic microchips and ultra-high density nonvolatile memory. A basic crossbar array configuration includes a set of conductive row wires and a set of conductive column wires formed to intersect the set of conductive row wires. The intersections between the two sets of wires are separated by so-called crosspoint devices, which can be formed from thin film material.

Crosspoint devices, in effect, function as the ANN's weighted connections between neurons. Nanoscale devices, for example memristors having "ideal" conduction state switching characteristics, are often used as the crosspoint devices in order to emulate synaptic plasticity with high energy efficiency. The conduction state (e.g., resistance) of the ideal memristor material can be altered by controlling the voltages applied between individual wires of the row and column wires. Digital data can be stored by alteration of the memristor material's conduction state at the intersection to achieve a high conduction state or a low conduction state. The memristor material can also be programmed to maintain two or more distinct conduction states by selectively setting the conduction state of the material. The conduction state of the memristor material can be read by applying a voltage across the material and measuring the current that passes through the target crosspoint device. So far, however, there have been some practical drawbacks in memristor and other resistive-random-access-memory (RRAM) based crosspoint devices that are detrimental to ANN applications; significant device-to-device variability and the asymmetry between "set (i.e. to increment resistance)" and "reset (i.e. to decrement resistance)" operations are two such main limitations.

However, in existing ANN techniques, input analog signals are converted into digital signals before feeding the input signals into the neural networks implemented using cross-point array(s). Such analog neural network uses "digital" inputs and "digital" output, requiring extensive digital to analog (D/A) and analog to digital (A/D) convertors. Particularly, in case of ANNs that receive image inputs for applying one or more machine learning techniques to the input images, such conversions cause reduction in accuracy, increase in power consumption, and increase in time and processing, among other disadvantages. Accordingly, it is a technical challenge to improve the accuracy, power consumption, and processing time and resources of such ANNs.

The technical solutions described herein address such technical challenges for ANNs that use the cross-point synaptic devices. As described in detail further, the technical solutions described herein utilize a smart image sensor device with normalized analog signal that is directly fed into a first level of the neural network. One or more embodiments of the present invention the image sensor device can be coupled with analog neural network synapses of the cross-point devices matrices extrinsically and/or intrinsically. Accordingly, the one or more embodiments of the present invention facilitate a reduced signal degradation compared to the conventional way of connecting image sensor to the cross-point synaptic array. Accordingly, the one or more embodiments of the present invention facilitate coupling the image sensor device to feed analog signals, in the form of voltages, directly to the cross-point array, accordingly addressing at least the technical challenges described herein.

The one or more embodiments of the present invention are applicable, for example, in case of cameras, such as hand held devices, because both sensor and neural network synapses in such devices are based on analog signals. As will be described herein, the neural network is trained to determine one or more labels associated with the image sensor device(s) to set final weights that can be loaded into a memory of the camera device for inference process. Further, in one or more examples, the one or more embodiments of the present invention can be implemented as a stand-alone, self-contained, portable system, for example, as a system on a chip (SoC) system with direct image capture and recognition capability. For visual inputs, a CMOS sensor can provide analog inputs for analog neural networks.

Here, "weight" refers to a computational value being used during computations of an ANN as described further.

Although embodiments of the present invention are directed to electronic systems, for ease of reference and explanation various aspects of the electronic systems are described using neurological terminology such as neurons, plasticity and synapses, for example. It will be understood that for any discussion or illustration herein of an electronic system, the use of neurological terminology or neurological shorthand notations are for ease of reference and are meant to cover the neuromorphic, ANN equivalent(s) of the described neurological function or neurological component.

Instead of utilizing the traditional digital model of manipulating zeros and ones, ANNs create connections between processing elements that are substantially the functional equivalent of the core system functionality that is being estimated or approximated. For example, IBM™'s SyNapse™ computer chip is the central component of an electronic neuromorphic machine that attempts to provide similar form, function and architecture to the mammalian brain. Although the IBM SyNapse computer chip uses the same basic transistor components as conventional computer chips, its transistors are configured to mimic the behavior of neurons and their synapse connections. The IBM SyNapse computer chip processes information using a network of just over one million simulated "neurons," which communicate with one another using electrical spikes similar to the synaptic communications between biological neurons. The IBM SyNapse architecture includes a configuration of processors (i.e., simulated "neurons") that read a memory (i.e., a simulated "synapse") and perform simple operations. The communications between these processors, which are typically located in different cores, are performed by on-chip network routers.

Figure 2:
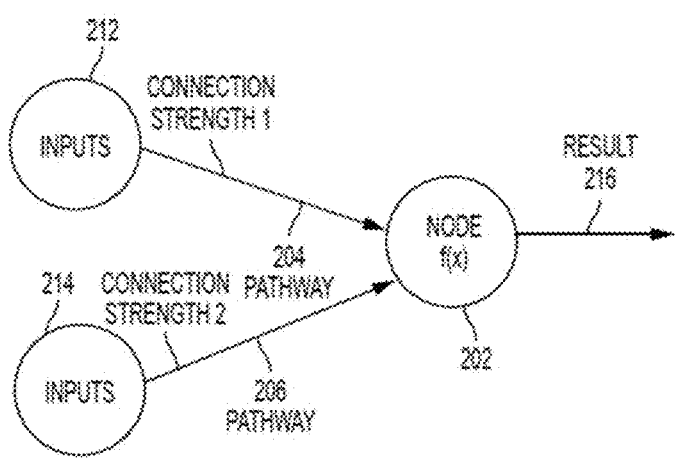
FIG. 2 depicts a known simplified model of the biological neuron shown in FIG. 1.
Figure 3:
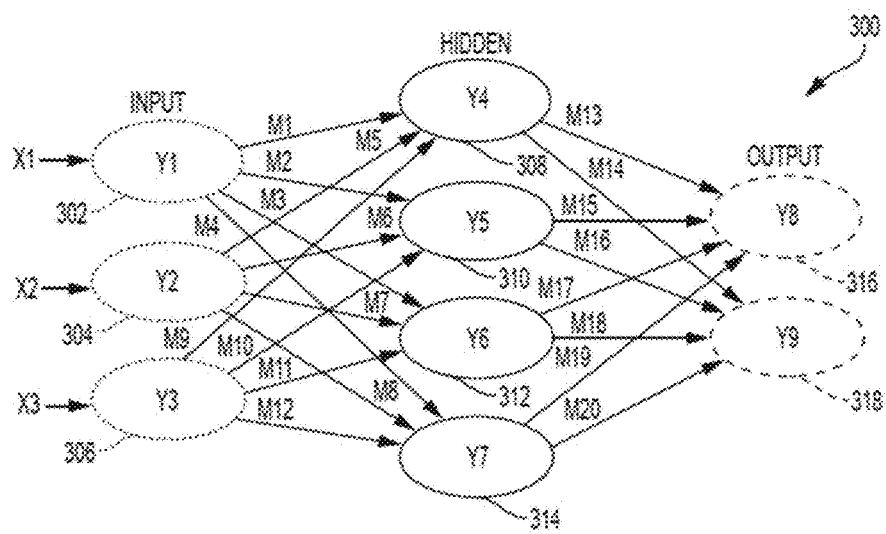
FIG. 3 depicts a known simplified model of an ANN incorporating the biological neuron model shown in FIG. 2.

A general description of how a typical ANN operates will now be provided with reference to FIGS. 1, 2 and 3. As previously noted herein, a typical ANN models the human brain, which includes about one hundred billion interconnected cells called neurons. FIG. 1 depicts a simplified diagram of a biological neuron 102 having pathways 104, 106, 108, 110 that connect it to upstream inputs 112, 114, downstream outputs 116 and downstream "other" neurons 118, configured and arranged as shown. Each biological neuron 102 sends and receives electrical impulses through pathways 104, 106, 108, 110. The nature of these electrical impulses and how they are processed in biological neuron 102 are primarily responsible for overall brain functionality. The pathway connections between biological neurons can be strong or weak. When a given neuron receives input impulses, the neuron processes the input according to the neuron's function and sends the result of the function to downstream outputs and/or downstream "other" neurons.

Biological neuron 102 is modeled in FIG. 2 as a node 202 having a mathematical function, f(x) depicted by the equation shown in FIG. 2. Node 202 takes electrical signals from inputs 212, 214, multiplies each input 212, 214 by the strength of its respective connection pathway 204, 206, takes a sum of the inputs, passes the sum through a function, f(x), and generates a result 216, which can be a final output or an input to another node, or both. In the present description, an asterisk (*) is used to represent a multiplication. Weak input signals are multiplied by a very small connection strength number, so the impact of a weak input signal on the function is very low. Similarly, strong input signals are multiplied by a higher connection strength number, so the impact of a strong input signal on the function is larger. The function f(x) is a design choice, and a variety of functions can be used. An example design choice for f(x) is the hyperbolic tangent function, which takes the function of the previous sum and outputs a number between minus one and plus one.

FIG. 3 depicts a simplified ANN model 300 organized as a weighted directional graph, wherein the artificial neurons are nodes (e.g., 302, 308, 316), and wherein weighted directed edges (e.g., m1 to m20) connect the nodes. It should be noted that the ANN model 300 depicted is a fully connected DNN, however, the technical solutions described herein are also applicable in case of other types of ANNs, such as CNN, partially connected DNN, and the like, and not just limited to a fully connected DNN. ANN model 300 is organized such that nodes 302, 304, 306 are input layer nodes, nodes 308, 310, 312, 314 are hidden layer nodes and nodes 316, 318 are output layer nodes. Each node is connected to every node in the adjacent layer by connection pathways, which are depicted in FIG. 3 as directional arrows having connection strengths m1 to m20. Although only one input layer, one hidden layer and one output layer are shown, in practice, multiple input layers, hidden layers and output layers can be provided.

Similar to the functionality of a human brain, each input layer node 302, 304, 306 of ANN 300 receives inputs x1, x2, x3 directly from a source (not shown) with no connection strength adjustments and no node summations. Accordingly, y1=f(x1), y2=f(x2) and y3=f(x3), as shown by the equations listed at the bottom of FIG. 3. Each hidden layer node 308, 310, 312, 314 receives its inputs from all input layer nodes 302, 304, 306 according to the connection strengths associated with the relevant connection pathways. Thus, in hidden layer node 308, y4=f(m1*y1+m5*y2+m9*y3), wherein * represents a multiplication. A similar connection strength multiplication and node summation is performed for hidden layer nodes 310, 312, 314 and output layer nodes 316, 318, as shown by the equations defining functions y5 to y9 depicted at the bottom of FIG. 3.

ANN model 300 processes data records one at a time, and it "learns" by comparing an initially arbitrary classification of the record with the known actual classification of the record. Using a training methodology knows as "backpropagation" (i.e., "backward propagation of errors"), the errors from the initial classification of the first record are fed back into the network and used to modify the network's weighted connections the second time around, and this feedback process continues for many iterations. In the training phase of an ANN, the correct classification for each record is known, and the output nodes can therefore be assigned "correct" values. For example, a node value of "1" (or 0.9) for the node corresponding to the correct class, and a node value of "0" (or 0.1) for the others. It is thus possible to compare the network's calculated values for the output nodes to these "correct" values, and to calculate an error term for each node (i.e., the "delta" rule). These error terms are then used to adjust the weights in the hidden layers so that in the next iteration the output values will be closer to the "correct" values.

There are many types of neural networks, but the two broadest categories are feed-forward and feedback/recurrent networks. ANN model 300 is a non-recurrent feed-forward network having inputs, outputs and hidden layers. The signals can only travel in one direction. Input data is passed onto a layer of processing elements that perform calculations. Each processing element makes its computation based upon a weighted sum of its inputs. The new calculated values then become the new input values that feed the next layer. This process continues until it has gone through all the layers and determined the output. A threshold transfer function is sometimes used to quantify the output of a neuron in the output layer.

A feedback/recurrent network includes feedback paths, which mean that the signals can travel in both directions using loops. All possible connections between nodes are allowed. Because loops are present in this type of network, under certain operations, it can become a non-linear dynamical system that changes continuously until it reaches a state of equilibrium. Feedback networks are often used in associative memories and optimization problems, wherein the network looks for the best arrangement of interconnected factors.

The speed and efficiency of machine learning in feed-forward and recurrent ANN architectures depend on how effectively the crosspoint devices of the ANN crossbar array perform the core operations of typical machine learning algorithms. Although a precise definition of machine learning is difficult to formulate, a learning process in the ANN context can be viewed as the problem of updating the crosspoint device connection weights so that a network can efficiently perform a specific task. The crosspoint devices typically learn the necessary connection weights from available training patterns. Performance is improved over time by iteratively updating the weights in the network. Instead of following a set of rules specified by human experts, ANNs "learn" underlying rules (like input-output relationships) from the given collection of representative examples. Accordingly, a learning algorithm can be generally defined as the procedure by which learning rules are used to update and/or adjust the relevant weights.

The three main learning algorithm paradigms are supervised, unsupervised and hybrid. In supervised learning, or learning with a "teacher," the network is provided with a correct answer (output) for every input pattern. Weights are determined to allow the network to produce answers as close as possible to the known correct answers. Reinforcement learning is a variant of supervised learning in which the network is provided with only a critique on the correctness of network outputs, not the correct answers themselves. In contrast, unsupervised learning, or learning without a teacher, does not require a correct answer associated with each input pattern in the training data set. It explores the underlying structure in the data, or correlations between patterns in the data, and organizes patterns into categories from these correlations. Hybrid learning combines supervised and unsupervised learning. Parts of the weights are usually determined through supervised learning, while the others are obtained through unsupervised learning.

As previously noted herein, in order to limit power consumption, the crosspoint devices of ANN chip architectures are often designed to utilize offline learning techniques, wherein the approximation of the target function does not change once the initial training phase has been resolved. Offline learning allows the crosspoint devices of crossbar-type ANN architectures to be simplified such that they draw very little power.

Figure 4:
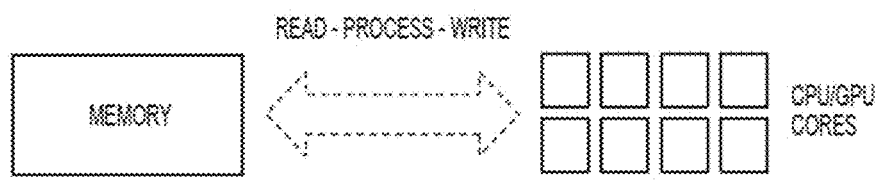
FIG. 4 depicts a simplified illustration of a typical read-process-write weight update operation.

Notwithstanding the potential for lower power consumption, executing offline training can be difficult and resource intensive because it is typically necessary during training to modify a significant number of adjustable parameters (e.g., weights) in the ANN model to match the input-output pairs for the training data. FIG. 4 depicts a simplified illustration of a typical read-process-write weight update operation, wherein CPU/GPU cores (i.e., simulated "neurons") read a memory (i.e., a simulated "synapse") and perform weight update processing operations, then write the updated weights back to memory. Accordingly, simplifying the crosspoint devices of ANN architectures to prioritize power-saving, offline learning techniques typically means that training speed and training efficiency are not optimized.

Figure 5:
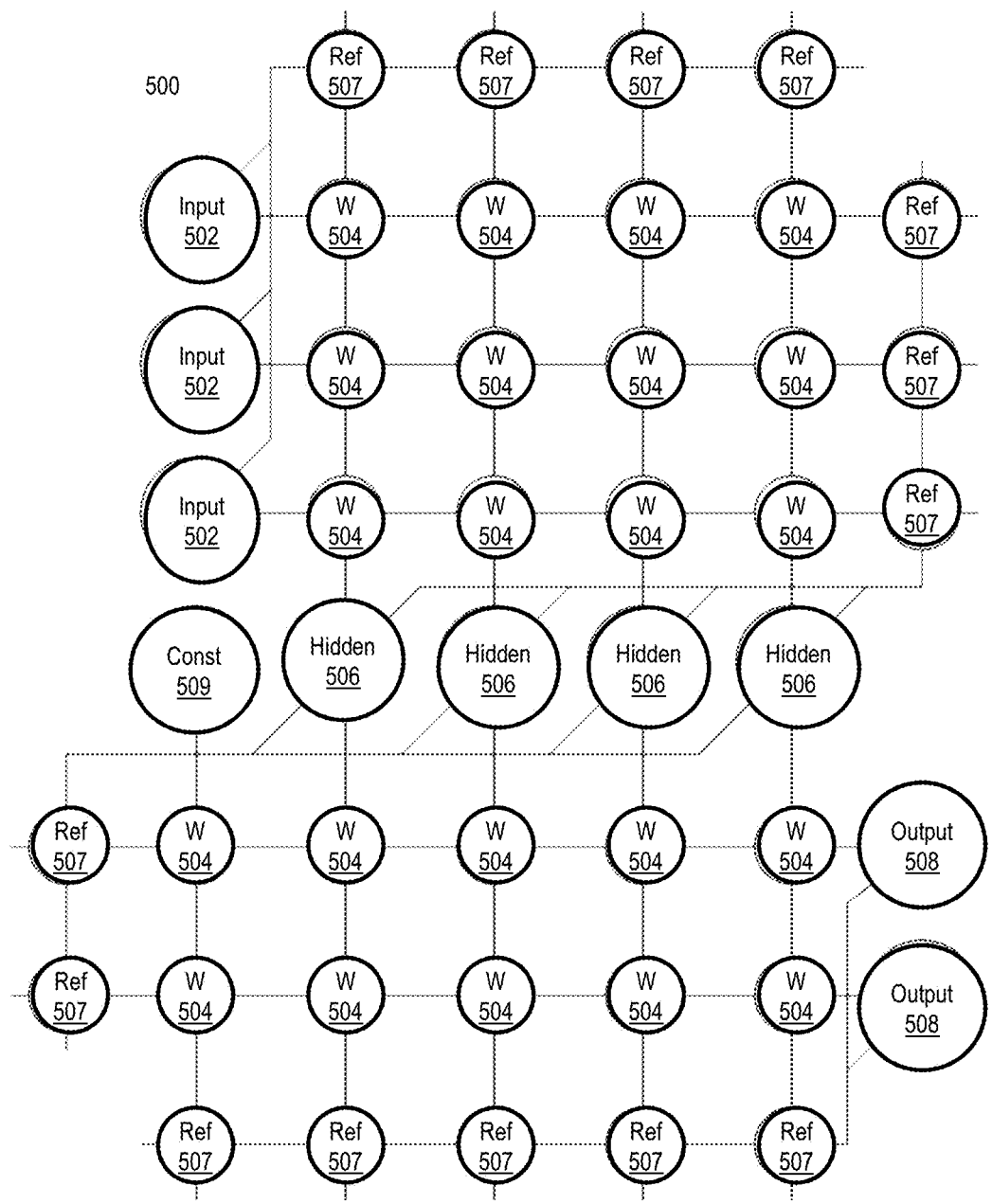
FIG. 5 illustrates an artificial neural network (ANN) architecture.

FIG. 5 illustrates an artificial neural network (ANN) architecture 500. During feed-forward operation, a set of input neurons 502 each provide an input voltage in parallel to a respective row of weights 504. A weight 504 is a crosspoint device, such as an RPU. The weights 504 each have a settable resistance value, such that a current output flows from the weight 504 to a respective hidden neuron 506 to represent the weighted input. The current output by a given weight is determined as $$I = \frac{V}{r},$$

where V is the input voltage from the input neuron 502 and r is the set resistance of the weight 504. The current from each weight adds column-wise and flows to a hidden neuron 506. A set of reference weights 507 have a fixed resistance and combine their outputs into a reference current that is provided to each of the hidden neurons 506. Because conductance values can only be positive numbers, some reference conductance is needed to encode both positive and negative values in the matrix. The currents produced by the weights 504 are continuously valued and positive, and therefore the reference weights 507 are used to provide a reference current, above which currents are considered to have positive values and below which currents are considered to have negative values.

The hidden neurons 506 use the currents from the array of weights 504 and the reference weights 507 to perform some calculation. The hidden neurons 506 then output a voltage of their own to another array of weights 507. This array performs in the same way, with a column of weights 504 receiving a voltage from their respective hidden neuron 506 to produce a weighted current output that adds row-wise and is provided to the output neuron 508.

It should be understood that any number of these stages can be implemented, by interposing additional layers of arrays and hidden neurons 506. It should also be noted that some neurons can be constant neurons 509, which provide a constant voltage to the array. The constant neurons 509 can be present among the input neurons 502 and/or hidden neurons 506 and are only used during feed-forward operation.

During back propagation, the output neurons 508 provide a voltage back across the array of weights 504. The output layer compares the generated network response to training data and computes an error. The error is applied to the array as a voltage pulse, where the height and/or duration of the pulse is modulated proportional to the error value. In this example, a row of weights 504 receives a voltage from a respective output neuron 508 in parallel and converts that voltage into a current which adds column-wise to provide an input to hidden neurons 506. The hidden neurons 506 combine the weighted feedback signal with a derivative of its feed-forward calculation and stores an error value before outputting a feedback signal voltage to its respective column of weights 504. This back propagation travels through the entire network 500 until all hidden neurons 506 and the input neurons 502 have stored an error value.

During weight updates, the input neurons 502 and hidden neurons 506 apply a first weight update voltage forward and the output neurons 508 and hidden neurons 506 apply a second weight update voltage backward through the network 500. The combinations of these voltages create a state change within each weight 504, causing the weight 504 to take on a new resistance value. In this manner, the weights 504 can be trained to adapt the neural network 500 to errors in its processing. It should be noted that the three modes of operation, feed forward, back propagation, and weight update, do not overlap with one another.

As previously noted herein, to accommodate the learning speed requirement for deep neural network application, the embodiments of the present invention provide an analog weight update component. For example, a cross-point synaptic device in a cross-bar structure can enable parallel matrix multiplication and improve the neural network training speed.

One or more embodiments of the invention provide a programmable resistive crosspoint component referred to herein as a crosspoint device, which provides local data storage functionality and local data processing functionality. In other words, when performing data processing, the value stored at each crosspoint device is updated in parallel and locally, which eliminate the need to move relevant data in and out of a processor and a separate storage element. Additionally, the local data storage and local data processing provided by the described crosspoint devices accelerate the ANN'S ability to implement algorithms such as matrix inversion, matrix decomposition and the like. Accordingly, implementing a machine learning ANN architecture having the described crosspoint device enables the implementation that optimize the speed, efficiency and power consumption of the ANN. The described crosspoint device and resulting ANN architecture improve overall ANN performance and enable a broader range of practical ANN applications.

The crosspoint device in the cross-bar structure enables parallel matrix multiplication and substantially enhances the neural network training speed. For online training using parallel processing, each weight element has to show symmetric updating characteristic, which means the previous state data has to be retrievable after updating is done, as is known in the art. For example, FETs, whose resistance can be well controlled by gate potential, is one candidate as a weight element for the neural network. In some cases the FETs are also put together with capacitor to prolong the storage of charge on the gate of the FETs.

Figure 6:
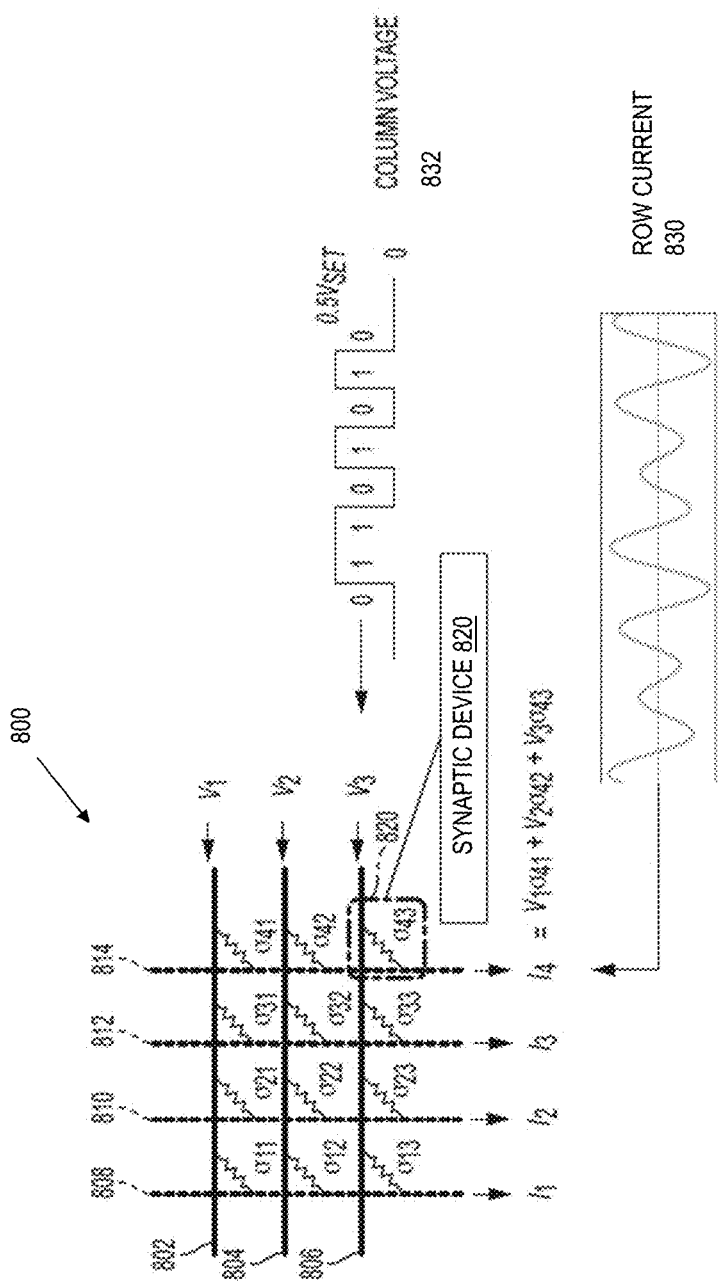
FIG. 6 is a diagram of a two-dimensional (2D) crossbar array according to one or more embodiments of the present invention.

FIG. 6 depicts a cross bar array of cross-point synaptic devices according to embodiments of the present invention, along with voltage sequences illustrating the operation of the RPU. FIG. 6 is a diagram of a two-dimensional (2D) crossbar array 800 that performs forward matrix multiplication, backward matrix multiplication and weight updates according to embodiments of the present invention. Crossbar array 800 is formed from a set of conductive row wires 802, 804, 806 and a set of conductive column wires 808, 810, 812, and 814 that intersect the set of conductive row wires 802, 804, and 806. The intersections between the set of row wires and the set of column wires are separated by crosspoint devices, which are shown in FIG. 6 as resistive elements each having its own adjustable/updateable resistive weight, depicted as σ11, σ21, σ31, σ41, σ12, σ22, σ32, σ42, σ13, σ23, σ33 and σ43, respectively. For ease of illustration, only one crosspoint device 820 is labeled with a reference number in FIG. 6. In forward matrix multiplication, the conduction state (i.e., the stored weights) of the crosspoint device can be read by applying a voltage across the RPU and measuring the current that passes through the crosspoint device.

Input voltages V1, V2, V3 are applied to row wires 802, 804, 806, respectively. An example input voltage 832 is depicted. Each column wire 808, 810, 812, 814 sums the currents I1, I2, I3, I4 generated by each crosspoint device along the particular column wire. For example, as shown in FIG. 6, the current I4 generated by column wire 814 is according to the equation $I4=V1/\sigma41+V2/\sigma42+V3/\sigma43$. Thus, array 800 computes the forward matrix multiplication by multiplying the values stored in the crosspoint devices by the row wire inputs, which are defined by voltages V1, V2, V3. The backward matrix multiplication is very similar. In backward matrix multiplication, input current 830 are applied at column wires 808, 810, 812, 814 then read from row wires 802, 804, 806. For weight updates, which are described in greater detail below, voltages are applied to column wires and row wires at the same time, and the conductance values stored in the relevant cross-point synaptic devices all update in parallel. Accordingly, the multiplication and addition operations required to perform weight updates are performed locally at each crosspoint device 820 of array 800 using the cross-point synaptic device itself plus the relevant row or column wire of array 800. Thus, in accordance with the one or more embodiments of the present invention, no read-update-write cycles (shown in FIG. 4) are required in array 800.

Accordingly, referring to the ANN implemented using a crosspoint array including crosspoint devices as described herein, in the array 800, the value of the resistance (or conductance) of each node determines the coupling between nodes, where a node is represented by an cross-point synaptic device in the array. Further, upon training the crosspoint array 800 according to the ANN, the resistance (or conductance) will be different from device to device, depending on the desired coupling. For training a neural network, it is necessary to actively adjust the resistance values. Once the training is complete, the resistance values remain fixed during operation of the crosspoint array circuit, until training begins for a new task.

Figure 7:
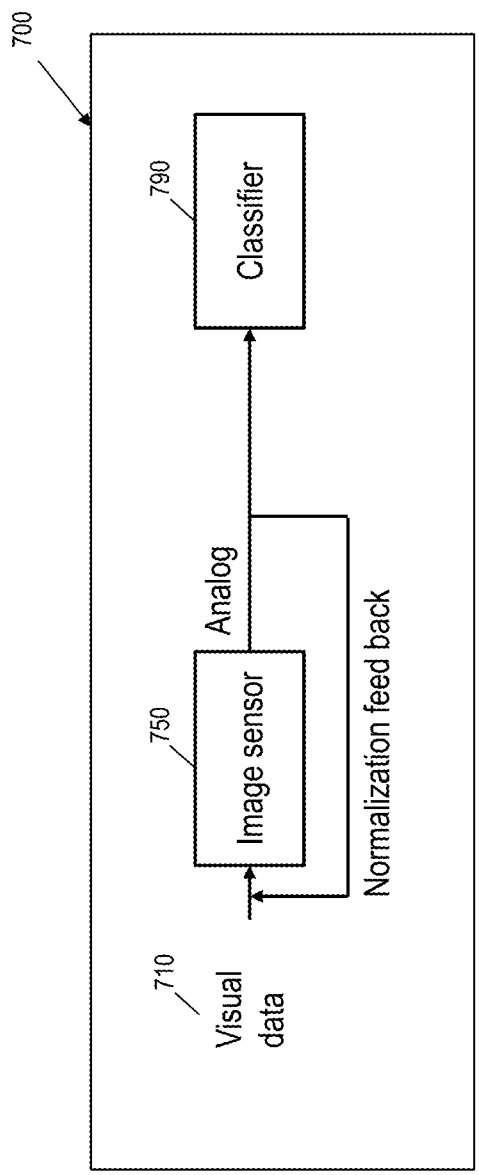
FIG. 7 depicts a block diagram of a neural network system for visual data classification according to one or more embodiments of the present invention.

FIG. 7 depicts a block diagram of a system 700 for visual data classification according to one or more embodiments of the present invention. In one or more examples, the system 700 can be a combination of a neural network system and an image sensor system that provides direct analog inputs to the neural network system. The block diagram depicts a classifier 790, which includes one or more of the cross-point synaptic arrays 800 with multiple cross-point devices at each intersection as described herein. In addition, the system 700 includes an image sensor array 750 that provides input to the classifier 790. The classifier 790 implements an ANN, CNN, or DNN to classify the visual data 710 according to one or more machine learning techniques. In existing systems, that image sensor 750 provides analog data that is digitalized by an A/D converter, and the resulting digital data is forwarded to the classifier 790. Such conversion causes loss in accuracy, requires additional time, and requires additional resources for the conversion compared to the one or more embodiments of the present invention. As depicted, the neural network system 700 does not perform A/D conversion, and instead facilitates the analog output of the image sensor 750 to be fed directly into the classifier 790. Further, the neural network system 700 uses a normalization feedback from the analog output of the image sensor 750 to adjust the operation of the image sensor 750.

Figure 8:
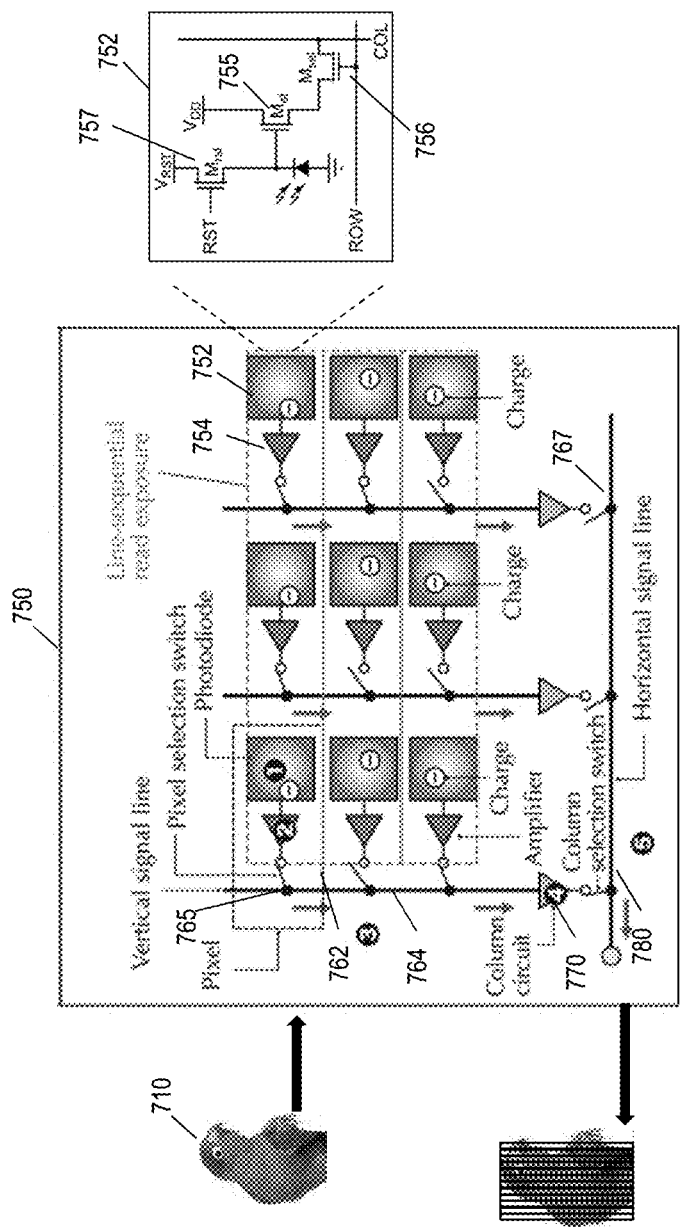
FIG. 8 depicts a block diagram to illustrate a structure of a typical image sensor.

FIG. 8 depicts a block diagram to illustrate a structure of a typical image sensor. The image sensor 750 includes a matrix of pixel sensors 752 (only one is labelled in FIG. 8), each pixel sensor 752 depicting a pixel in the image/visual data 710 being received. The pixel sensors 752 are arranged at intersections in a matrix connection of row wires/lines 762 and column wires/lines 764. It should be noted that the number of pixel sensors 752, row wires 762, and column wires 764, are examples and that in other examples, the numbers can be different. An example pixel sensor 752 is also depicted by a three-transistor active pixel sensor (APS). The input light received by the APS generates a charge which is accumulated on gate of transistor 755. Further, a row switch 765 to the APS 752 is opened by the row wire 762, and the generated charge goes to an output signal line via the column wire 764 in the image sensor 750.

In one or more examples, a charge amplifier 770 amplifies the charge generated by a column of the APS 752. Typically, when a column switch 767 for one column is closed, column switches for other columns are open. Accordingly, the APS 752 that are switched "ON" ripples down the generated charges along the column wire 764, generating a series of pulses in the signal line representing light intensity that is input and detected by the APS 752 along the column. The next column then repeats in the similar manner. Further, a horizontal signal line 780 is used to send the scanned image as input feed into the classifier 790. Such an image sensor 750 provides a digitized version (A/D converted) of the visual data 710 to the classifier 790.

Figure 9:
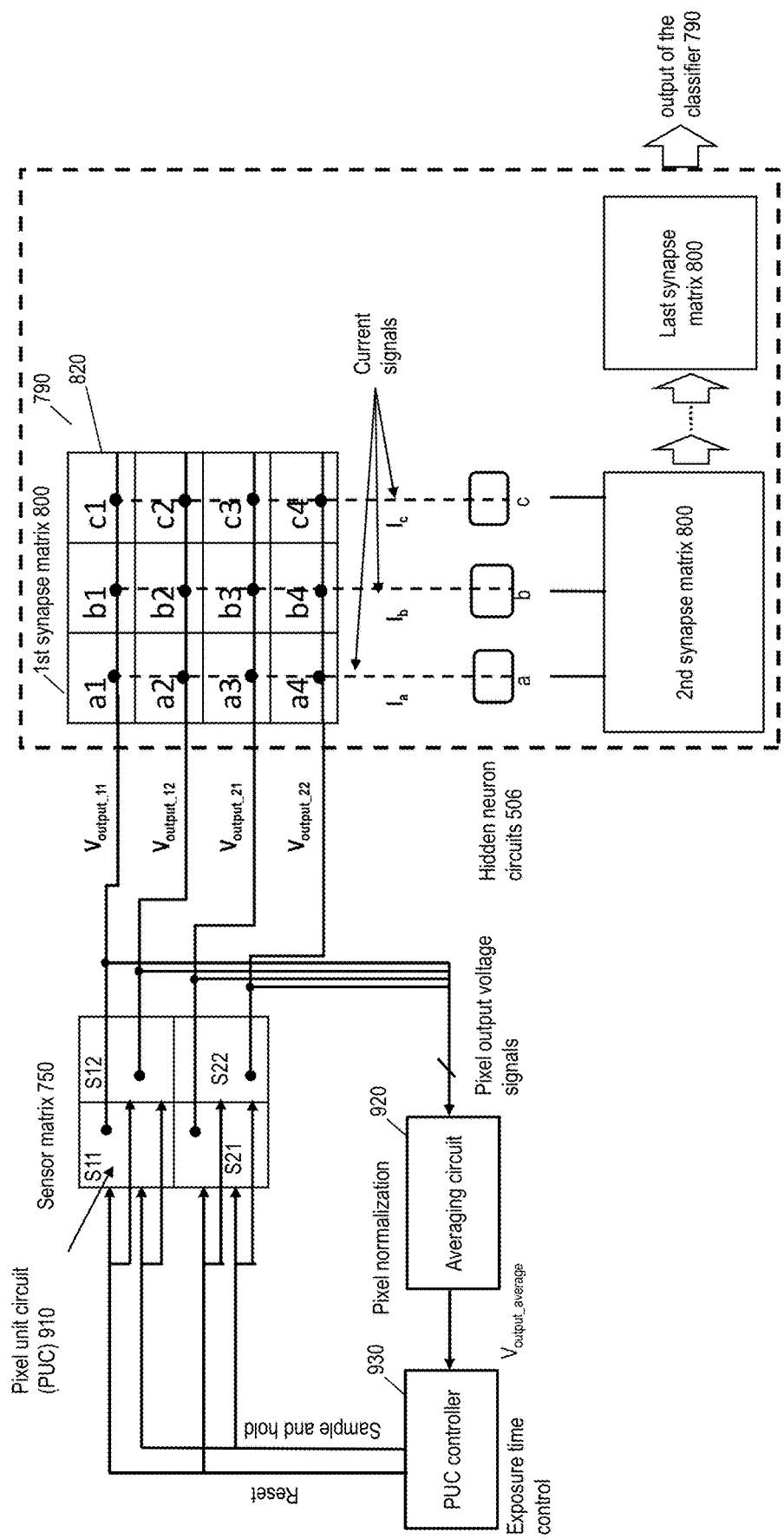
FIG. 9 depicts a block diagram for an image sensor according to one or more embodiments of the present invention.

FIG. 9 depicts a block diagram for an image sensor 750 according to one or more embodiments of the present invention. The image sensor 750 is depicted as a 2×2 matrix of pixel unit circuits (PUC) 910 (S11, S12, S21, and S22). Each PUC 910 represents a pixel of the visual data 710. It should be noted that in other examples, the image sensor 750 can include a different number of PUCs 910.

In the depicted embodiment, the image sensor 750 is extrinsic to the classifier 790, that is the image sensor 750 and the classifier 790 are separate components that are electronically connected to each other using conductors, such as via, one or more ports, one or more connectors, or any other such coupling. Each PUC 910 is connected to a row input of the cross-point synapse matrix 800 of the classifier 790. The charge output from each PUC 910 is accordingly, directly passed into the row input, without A/D conversion.

In one or more examples, the classifier includes multiple cross-point synapse matrices 800 connected to each other using hidden neuron circuits 506 as described herein. In such cases, the output of a first cross-point synapse matrix 800 is coupled with a second cross-point synapse matrix 800 in the classifier, which in turn can update further cross-point synapse matrices. A last layer cross-point synapse matrix of the classifier 790 provides the output of the classifier 790, for example indicating a category of the received image (visual data 710), a detected shape, person, or any other classification output.

The voltage output signals from the PUC 910 are also fed into an averaging circuit 920, which computes an average voltage signal based on the voltage outputs of the PUC 910 in the image sensor 750. The average voltage signal is forwarded to a PUC controller 930. The PUC controller 930 generates a reset signal and a sample-and-hold signal that is provided to each of the PUC 910 for controlling exposure time of the image sensor 750.

Figure 10:
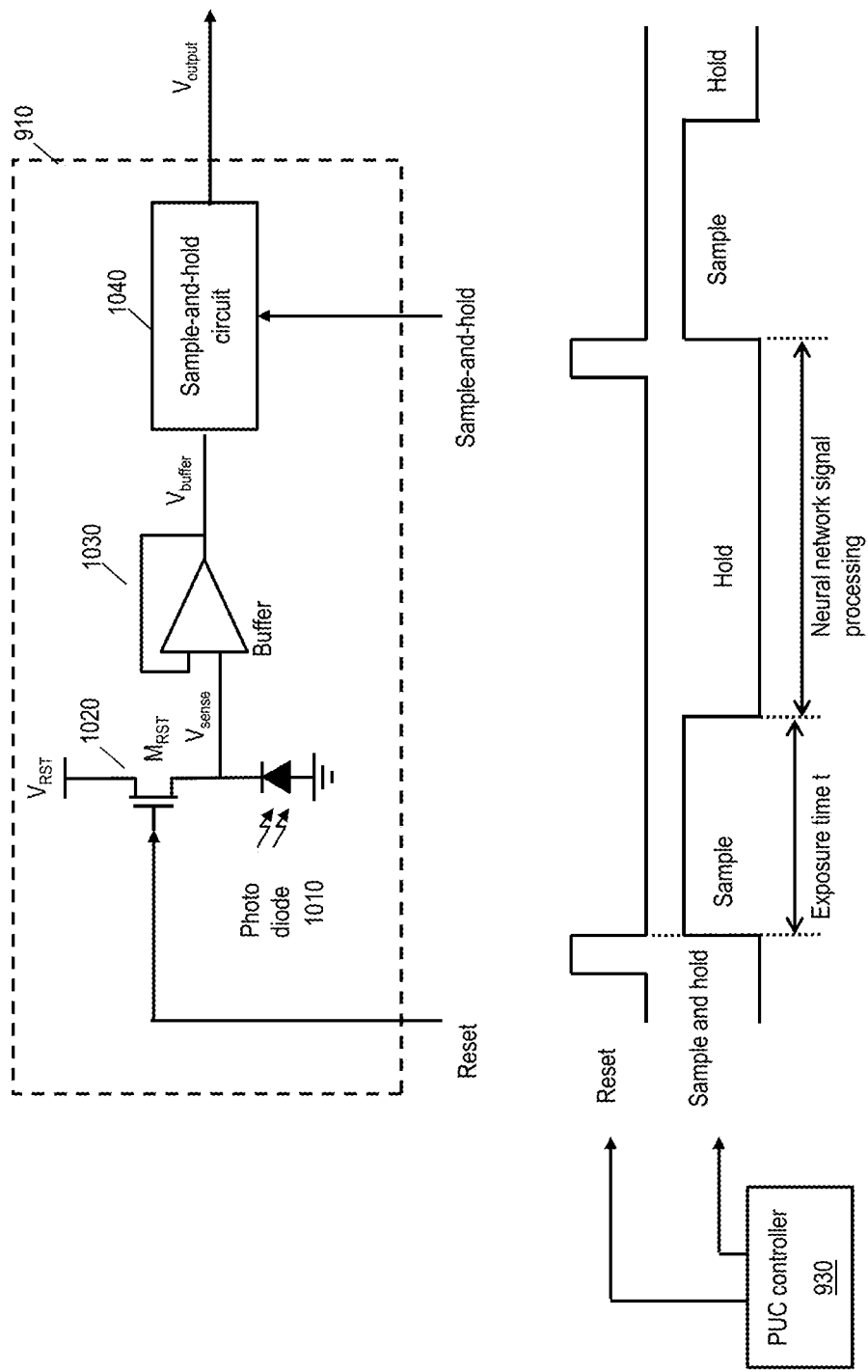
FIG. 10 depicts a block circuit diagram of a pixel unit circuit according to one or more embodiments of the present invention.

FIG. 10 depicts a block circuit diagram of the PUC 910 according to one or more embodiments of the present invention. The PUC 910 includes a photodiode 1010 that generates the charge which then builds the voltage (Vsense) based on incoming light according to the visual data 710. The voltage (Vsense) is provided to a buffer circuit 1030, for example a feedback op-amp. The buffer circuit generates a Vbuffer that is fed into a sample-and-hold circuit 1040 that outputs a Voutput voltage in response to receiving a sample-and-hold signal from the PUC controller 930.

FIG. 10 further depicts a timing diagram of the image capture and processing being controlled by the PUC controller 930 using the reset and sample-and-hold signals. The PUC controller 930 initiates the process of the photodiode 1010 receiving the input visual data 710 using the reset signal that is provided via a transistor 1020. When the reset signal is high, the transistor 1020 couples Vsense to VRST. When the reset signal falls back to low, the transistor 1020 forwards the Vsense to the buffer circuit 1030. The photodiode 1010 generates the Vsense output for a predetermined exposure time t. The exposure time t can be adjusted by adjusting a "sample" duration of the sample-and-hold signal. Once the exposure time t is completed, a "hold" duration of the sample-and-hold signal is started during which the neural network signal processing is performed. The PUC controller 930 repeats the "sample" and "hold" durations for further image capture and processing. Each "sample" and "hold" cycle is initiated with a reset signal being provided to capture a new input for each cycle. It should be noted that in other examples, the reset and sample-and-hold signals can be used in a different pattern to perform the image capture and processing.

Figure 11:
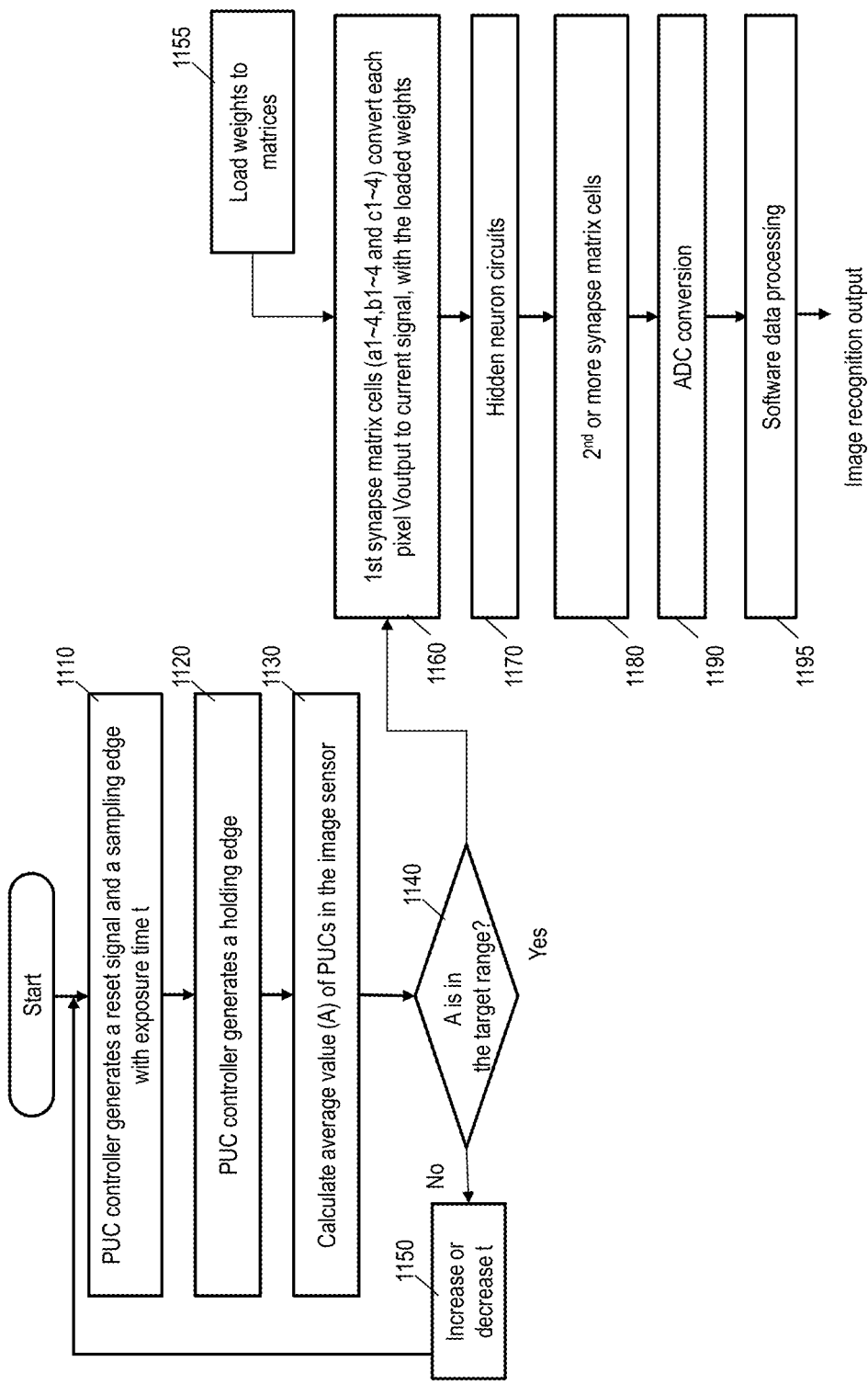
FIG. 11 depicts a flowchart of a method for controlling an image sensor using the a pixel unit circuit controller to provide visual data to an ANN system according to one or more embodiments of the present invention.

FIG. 11 depicts a flowchart of a method for controlling the image sensor 750 using the PUC controller 930 to provide visual data to an ANN system according to one or more embodiments of the present invention. The method includes PUC controller 930 generating the reset signal and a sampling edge with exposure time t, at 1110. The reset signal enables the photodiode 1010, and the sampling edge enables the sample-and-hold circuit 1040.

Further, the PUC controller generates a holding edge after the exposure time t is completed, at 1120. The holding edge causes the sampled voltage at Voutput to be held.

The method further includes the PUC controller 930 calculating an average value (A) of the voltage outputs of the PUCs 910 in the image sensor 750, at 1130. In one or more examples, the averaging circuit 920 that computes the average value is separate from the PUC controller 930. Alternatively, or in addition, the averaging circuit 920 is part of the PUC controller 930.

In one or more examples, the PUC controller 930 checks if the average value is within a predetermined target range, at 1140. If not, the PUC controller 930 adjusts the exposure time t, at 1150. Adjusting the exposure time t can include increasing or decreasing the exposure time t depending on whether the average value is below or above the target range, respectively.

If the average value is within the target rate (at 1140), the image sensor 750 loads the weight matrices in the first synapse matrix 800 in the classifier 790, at 1155. The weight matrices that are loaded can include predetermined initial values, and the weight matrices are updated during each iteration of the neural network system, if required. Further, the PUC controller 930 feeds the Voutput from each PUC 910 into a corresponding cross-point synaptic device 820 in the first synapse matrix 800, at 1160. As described herein, the cross-point synaptic devices 820 (a1~4, b1~4 and c1~4 in FIG. 9) convert each PUC 910 Voutput to corresponding current signals using the loaded weights. For example, the loaded weight matrix values can be resistance values, capacitance values, conductance values, and the like, to generate the current signals. While Voutput is on hold in the image sensor 750, the synapse matrix cells start working, accordingly facilitating more efficient processing.

In one or more examples, the current signals are forwarded into the hidden neurons 506 for adjusting weight values for one or more synapse matrices 800 in the classifier 790, at 1170. If the classifier 790 includes additional synapse matrices, such as a second cross-point synapse matrix or more, the synapse matrices are initiated with corresponding weight values and the current signals from the first synapse matrix are input to the synapse matrices for further computation, at 1180.

Further yet, in one or more examples, an A/D conversion of the current signals or voltage signals is performed at this stage to facilitate execution of one or more software algorithms to provide image recognition output, at 1190 and 1195.

Figure 12:
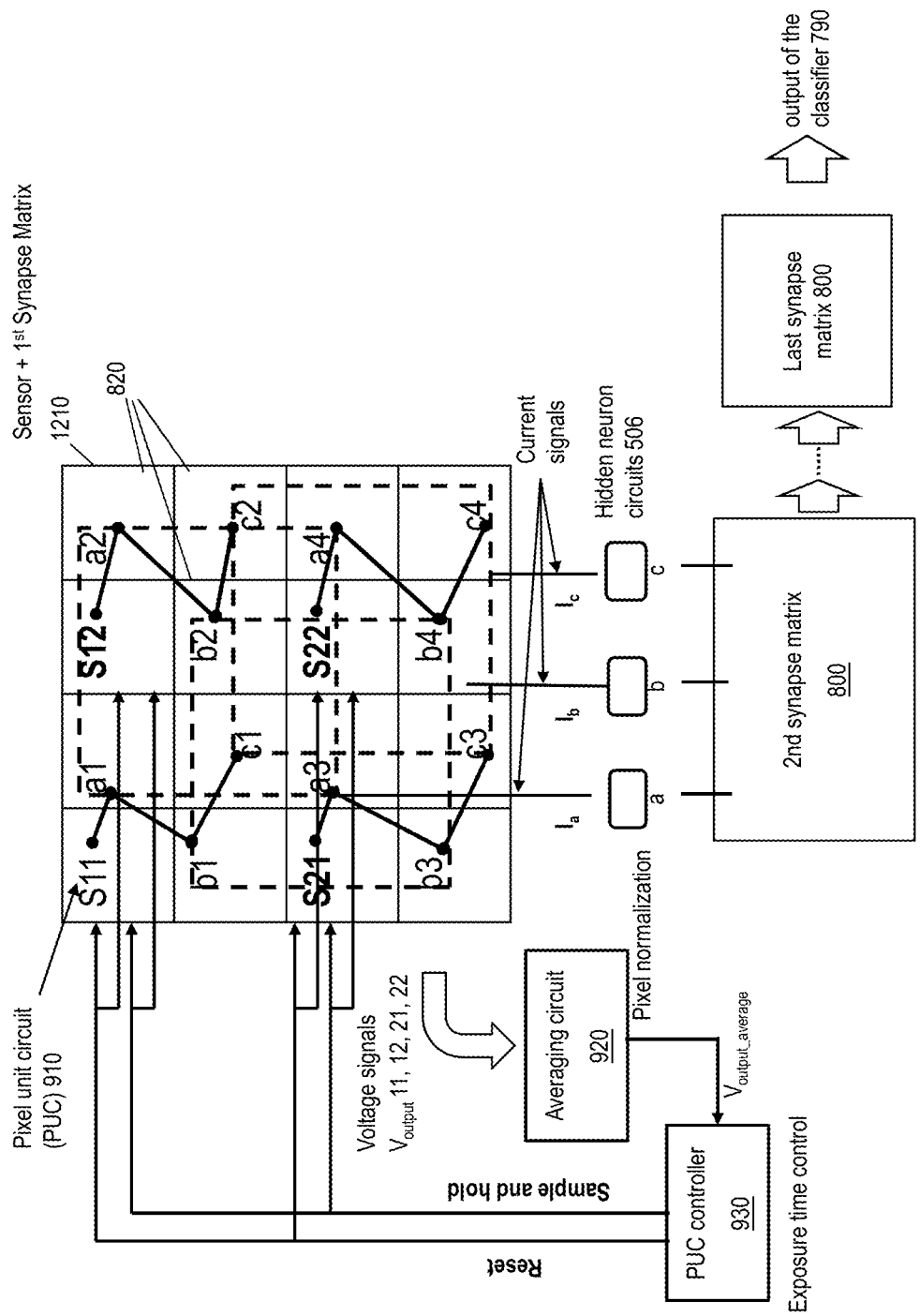
FIG. 12 depicts a block diagram of a neural network system for visual data classification according to one or more embodiments of the present invention.

FIG. 12 depicts a block diagram for an image sensor 750 according to one or more embodiments of the present invention. In the depicted embodiment, a single chip 1210 combines the image sensor 750 with the cross-point synaptic array 800 of the classifier 790. The image sensor 750 includes the PUC 910 (S11, S12, S21, and S22). Each PUC 910 represents a pixel of the visual data 710. It should be noted that in other examples, the image sensor 750 can include a different number of PUCs 910. Each PUC 910 is integrated with one or more cross-synaptic device 820 that is part of the cross-point synaptic array 800.

If the classifier 790 includes more than one cross-point synaptic arrays 800, the image sensor PUCs 910 are integrated with the first cross-point synaptic array 800 of the classifier 790. In other words, the image sensor elements are co-arranged with cross-point synapse elements from the cross-point matrix 800. In one or more examples, the integration of the PUCs 910 and the cross-point devices 820 is performed such that voltage output of an nth PUC 910 are connected to inputs of an nth row (an, bn, cn, . . . ) of the cross-point synapse matrix 800. In the depicted example, the synapse matrix columns are formed by elements (a1, a2 . . . ), (b1, b2 . . . ), (c1, c2 . . . ) . . . . Accordingly, PUC S11 is integrated with a first row of the cross-point synapse matrix 800—a1, b1, c1; PUC S12 is integrated with a second row of the cross-point synapse matrix 800—a2, b2, c2; PUC S21 is integrated with a third row of the cross-point synapse matrix 800—a3, b3, c3; and PUC S22 is integrated with a first row of the cross-point synapse matrix 800—a4, b4, c4. It should be noted that in other examples, a different number of rows and accordingly a different number of PUCs 910 can be included in the chip 1210.

The chip 1210 further includes the PUC controller 930 and the averaging circuit 920 that controls the exposure time t according to the pixel normalization (averaging). As described herein (see at least FIG. 9), the first synapse matrix 800 computes current signals based on the voltage outputs (Voutput) from the PUCs 910. The current signals are further fed into other synapse matrix of the classifier 790 and/or used for performing image classification algorithms using neural network techniques implemented using the synapse matrices 800. The PUC controller 930 generates and sends the reset signal and the sample-and-hold signal to the chip 1210 to control the PUCs 910 to send the voltage outputs Voutput directly to the corresponding cross-point devices without A/D conversion. The method depicted by the flowchart in FIG. 11 is applicable for the operation of the chip 1210.

Accordingly, one or more embodiments of the present invention provide a neural network system that includes an image sensor matrix 750 that includes X columns and Y rows of PUCs 910. The image sensor matrix 750 is coupled with a first synapse matrix 800 that includes X×Y rows and Z columns of cross-point synaptic devices 820, which can also be referred to as matrix unit circuit/cell (MUC). The coupling between the PUCs 910 and the MUCs 820 can include metal connections to connect from each PUC 910 to one row of the first synapse matrix 800. Further, the neural network system 700 includes a first hidden neuron array including Z hidden neurons 506. The metal connections further include connections to connect from each column of the first synapse matrix 800 to one of the hidden neurons 506.

In one or more examples, the neural network system 700 further includes a second synapse matrix 800 that includes Z columns and U rows of MUCs 820. Further, metal connections connect from each hidden neuron 506 of the first hidden neuron array to one column of the second synapse matrix 800. The second synapse matrix further connects to one or more hidden neuron arrays and one or more synapse matrices 800.

According to one or more embodiments of the present invention, the image sensor matrix 750 is implemented on a first piece of semiconductor chip, and the first synapse matrix 800, the first hidden neuron array 506 and the second synapse matrix 800 are implemented on a second (separate) piece of semiconductor chip. Alternatively, the image sensor matrix 750 is implemented on the same piece of semiconductor chip with the first synapse matrix 800, the first hidden neuron array 506, and the second synapse matrix 800.

According to one or more embodiments of the present invention, a device includes the image sensor 750 integrated with the synapse matrix 800. The devices includes X columns and Y rows of integrated unit cells. The integrated unit cell includes one PUC 910 and Z MUCs 820, where said PUC 910 is connected to the corresponding Z MUCs 820. The device further includes a first hidden neuron array that includes Z hidden neurons 506. In this case, the device includes Z metal connections, each to connect one MUC 820 from each integrated unit cell and to further connect to one hidden neuron 506 in the first hidden neuron array.

In one or more examples, the device also includes a second synapse matrix 800 with Z columns and U rows of MUCs. Further, the metal connections also connect from each hidden neuron 506 of the first hidden neuron array to one column of the second synapse matrix 800. The second synapse matrix 800 further connects to one or more hidden neuron arrays and one or more synapse matrices in the classifier 790. The integrated sensor plus synapse matrix is implemented on a single piece of semiconductor chip with the first hidden neuron array and the second synapse matrix. In one or more examples, the semiconductor chip can further include a third or more synapse matrices.

The technical solutions described herein improve neuromorphic development process by facilitating the image sensor output directly to ANN based classifier in the form of voltage signals without ADC conversion. The embodiments of the present invention are rooted in computer technology, particularly ANNs and provide improvements to the performance of the same.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. An image processing system comprising:
    a cross-point synapse array comprising:
        a plurality of row wires,
        a plurality of column wires, and
        a plurality of cross-point devices, a cross-point device at each intersection of the row wires and the column wires stores a weight value;
    an image sensor array comprising a plurality of pixel unit circuits, each pixel unit circuit is connected to a corresponding row wire of the cross-point synapse array, wherein the pixel unit circuit generates a voltage output based on an input light, wherein the cross-point synapse array converts the voltage output of each pixel unit circuit to a current value using the weight value stored at each cross-point device; and
    a pixel unit controller that adjusts an exposure time of the pixel unit circuits based on a plurality of voltage outputs from the plurality of pixel unit circuits respectively.

2. The image processing system of claim 1, wherein adjusting the exposure time by the pixel unit controller comprises:
    computing an average value of the plurality of voltage outputs from the plurality of pixel unit circuits; and
    determining if the average value is within a predetermined range, and adjusting the exposure time in response to the average value not being in the predetermined range.

3. The image processing system of claim 1, wherein the pixel unit circuit comprises a photodiode that generates the voltage output based on input light received for the exposure time based on a sample-and-hold signal received from the pixel unit controller.

4. The image processing system of claim 3, wherein the pixel unit circuit comprises a transistor that receives a reset signal from the pixel controller in response to which the photodiode generates a second voltage output.

5. The image processing system of claim 1, wherein the image sensor array and the cross-point synapse array are part of a single chip.

6. The image processing system of claim 1, wherein the cross-point synapse array is a first cross-point synapse array and a neural network system further comprising a second cross-point synapse array, the first cross-point synapse array connected to the second cross-point synapse array via a hidden neuron array.

7. The image processing system of claim 1, wherein the image sensor array comprises X column wires and Y row wires with the pixel unit circuits at each intersection, and the cross-point synapse array comprises X×Y row wires and Z column wires.

8. A system comprising:
    a cross-point synapse array comprising:
        a plurality of row wires;
        a plurality of column wires;
        a plurality of cross-point devices, a cross-point device at each intersection of the row wires and the column wires stores a weight value; and
        a plurality of pixel unit circuits, each pixel unit circuit is coupled with a predetermined set of cross-point devices, wherein the pixel unit circuit generates a voltage output based on an input light, the voltage output being sent to the set of cross-point devices for conversion to corresponding current signals, wherein the cross-point synapse array converts the voltage output of each pixel unit circuit to a corresponding current value using the weight value stored at each cross-point device; and a pixel unit controller coupled with the cross-point synapse array, the pixel unit controller adjusts an exposure time of the pixel unit circuits based on a plurality of voltage outputs from the plurality of pixel unit circuits respectively.

9. The system of claim 8, wherein adjusting the exposure time by the pixel unit controller comprises:

computing an average value of the plurality of voltage outputs from the plurality of pixel unit circuits; and determining if the average value is within a predetermined range, and adjusting the exposure time in response to the average value not being in the predetermined range.

10. The system of claim 8, wherein the pixel unit circuit comprises a photodiode that generates the voltage output based on input light received for the exposure time based on a sample-and-hold signal received from the pixel unit controller.

11. The system of claim 10, wherein the pixel unit circuit comprises a transistor that receives a reset signal from the pixel controller in response to which the photodiode generates a second voltage output.

12. The system of claim 8, wherein the cross-point synapse array comprises X column wires and Y row wires with each intersection comprising a pixel unit circuit and the corresponding set of cross-point devices.

13. The system of claim 8 further comprising a hidden neuron array comprising Z cross-point devices, Z being the number of cross-point devices in each of the sets of cross-point devices, each of the cross-point devices from the hidden neuron array connected to the cross-point devices from a corresponding set of cross-point devices.

14. The system of claim 13, wherein the cross-point synapse array is a first cross-point synapse array, and the system further comprises a second cross-point synapse array comprising Z columns and U rows of cross-point devices, each column of the second cross-point synapse array connected to a respective cross-point device from the hidden neuron array.

15. A computer-implemented method for operating a neural network system, the computer-implemented method comprising:

receiving, by a plurality of pixel unit circuits in an image sensor array, a reset signal from a pixel unit controller, each pixel unit circuit is connected to a corresponding row wire of a cross-point synapse array, the cross-point synapse array comprising a plurality of row wires, a plurality of column wires, and a plurality of cross-point devices, wherein a cross-point device at each intersection of the row wires and the column wires stores a weight value;

receiving, by the plurality of pixel unit circuits in the image sensor array, a sample-and-hold signal from the pixel unit controller, each pixel unit circuit generating a voltage output based on an input light for an exposure time duration of a sample phase of the sample-and-hold signal;

sending the voltage output from the plurality of pixel unit circuits in the image sensor array to corresponding cross-point devices in a cross-point synapse array for conversion to corresponding current signals during a hold phase of the sample-and-hold signal, wherein the cross-point synapse array converts the voltage output of each pixel unit circuit to a current value using the weight value stored at each cross-point device; and adjusting, by the pixel unit controller, the exposure time of the pixel unit circuits based on the voltage outputs from the plurality of pixel unit circuits respectively.

16. The computer-implemented method of claim 15, wherein adjusting the exposure time by the pixel unit controller comprises:

computing an average value of the voltage outputs from the plurality of pixel unit circuits; and determining if the average value is within a predetermined range, and adjusting the exposure time in response to the average value not being in the predetermined range.

17. The computer-implemented method of claim 15, wherein the pixel unit circuit comprises a photodiode that generates the voltage output based on input light received for the exposure time based on a sample-and-hold signal received from the pixel unit controller.

18. The computer-implemented method of claim 17, wherein the pixel unit circuit comprises a transistor that receives a reset signal from the pixel controller in response to which the photodiode generates a second voltage output.

19. The computer-implemented method of claim 15, wherein the image sensor array and the cross-point synapse array are part of a single chip.

20. The computer-implemented method of claim 15, wherein the image sensor array comprises X column wires and Y row wires with the pixel unit circuits at each intersection, and the cross-point synapse array comprises X×Y row wires and Z column wires.

* * * * *